US012610727B2

(12) United States Patent
Lee et al.

(10) Patent No.: US 12,610,727 B2
(45) Date of Patent: Apr. 21, 2026

(54) ARRAY SUBSTRATE, DISPLAY PANEL AND METHOD FOR REPAIRING BAD SPOTS ON THE PANEL

(71) Applicant: HKC CORPORATION LIMITED, Shenzhen (CN)

(72) Inventors: Won Kyu Lee, Shenzhen (CN); Seung Kyu Choi, Shenzhen (CN); Kerong Wu, Shenzhen (CN); Il Nam Song, Shenzhen (CN); Hae Won Kim, Shenzhen (CN); Boling Tang, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 579 days.

(21) Appl. No.: 17/935,705

(22) Filed: Sep. 27, 2022

(65) Prior Publication Data

US 2023/0104974 A1 Apr. 6, 2023

(30) Foreign Application Priority Data

Sep. 28, 2021 (CN) .......................... 202111155838.4

(51) Int. Cl.
   *H10K 71/00* (2023.01)
   *H10K 59/121* (2023.01)
      (Continued)
(52) U.S. Cl.
   CPC ......... *H10K 71/00* (2023.02); *H10K 59/1216* (2023.02); *H10K 59/122* (2023.02);
      (Continued)
(58) Field of Classification Search
   CPC .. H10K 71/861; H10K 71/00; H10K 59/1216; H10K 59/122; H10K 59/123;
      (Continued)

(56) References Cited

U.S. PATENT DOCUMENTS

| | | | | |
|---|---|---|---|---|
| 9,406,729 | B2 * | 8/2016 | Jin ....................... | H10K 59/123 |
| 2007/0046186 | A1 * | 3/2007 | Kim ..................... | H10K 50/813 |
| | | | | 313/504 |

(Continued)

FOREIGN PATENT DOCUMENTS

| | | | | |
|---|---|---|---|---|
| CN | 112034656 A | | 12/2020 | |
| CN | 113257883 A | * | 8/2021 | ......... H10K 59/1201 |
| CN | 113707694 A | * | 11/2021 | ........... H10K 59/126 |

OTHER PUBLICATIONS

Joohan Lee et al, "Analysis of Energy Process Window of Laser Metal Pad Cut Link Structure", May 2003, IEEE Transactions on Semiconductor Manufacturing, vol. 16, No. 2, pp. 299-306 (Year: 2003).*

(Continued)

*Primary Examiner* — Mohammed Shamsuzzaman
(74) *Attorney, Agent, or Firm* — Westbridge IP LLC

(57) ABSTRACT

Disclosed are an array substrate, a display panel and a method for repairing bad spots on the panel. The array substrate includes a substrate and a plurality of data lines and a plurality of scan lines provided on the substrate, the plurality of the data lines and a plurality of the scan lines are insulated and intersected mutually to define a plurality of sub-pixel areas provided in an array, each sub-pixel area is provided with a sub-pixel, the sub-pixel includes a plurality of pixel electrodes provided in a same layer and spaced to form a plurality of light-emitting areas, two adjacent pixel electrodes are electrically connected to each other via a connection electrode, and a pixel driving circuit is electrically connected to a corresponding data line, a corresponding scan line, and a corresponding pixel electrode.

10 Claims, 8 Drawing Sheets

(51) Int. Cl.
    *H10K 59/122*     (2023.01)
    *H10K 59/123*     (2023.01)
    *H10K 59/131*     (2023.01)

(52) U.S. Cl.
    CPC ......... *H10K 59/123* (2023.02); *H10K 59/131*
        (2023.02); *H10K 71/861* (2023.02)

(58) Field of Classification Search
    CPC .. H10K 59/131; H10K 59/1213; H10K 59/12;
        H01L 22/12; H01L 22/22
    See application file for complete search history.

(56)                References Cited

U.S. PATENT DOCUMENTS

| | | | |
|---|---|---|---|
| 2008/0062096 A1* | 3/2008 | Yamashita ........... | H10K 59/131 |
| | | | 345/82 |
| 2015/0144904 A1* | 5/2015 | Jeong ................. | H10K 59/1213 |
| | | | 438/4 |
| 2017/0194604 A1* | 7/2017 | Chun ................... | H10K 50/813 |
| 2018/0210250 A1 | 7/2018 | Wang et al. | |
| 2019/0103456 A1* | 4/2019 | Choi .................... | H10K 59/131 |
| 2020/0135090 A1* | 4/2020 | Lee ........................ | G09G 3/006 |
| 2021/0143373 A1* | 5/2021 | Kim ....................... | H10K 59/87 |

OTHER PUBLICATIONS

Notification to Grant Patent Right for Invention issued in counterpart Chinese Patent Application No. 202111155838.4, dated Jun. 15, 2022.

\* cited by examiner

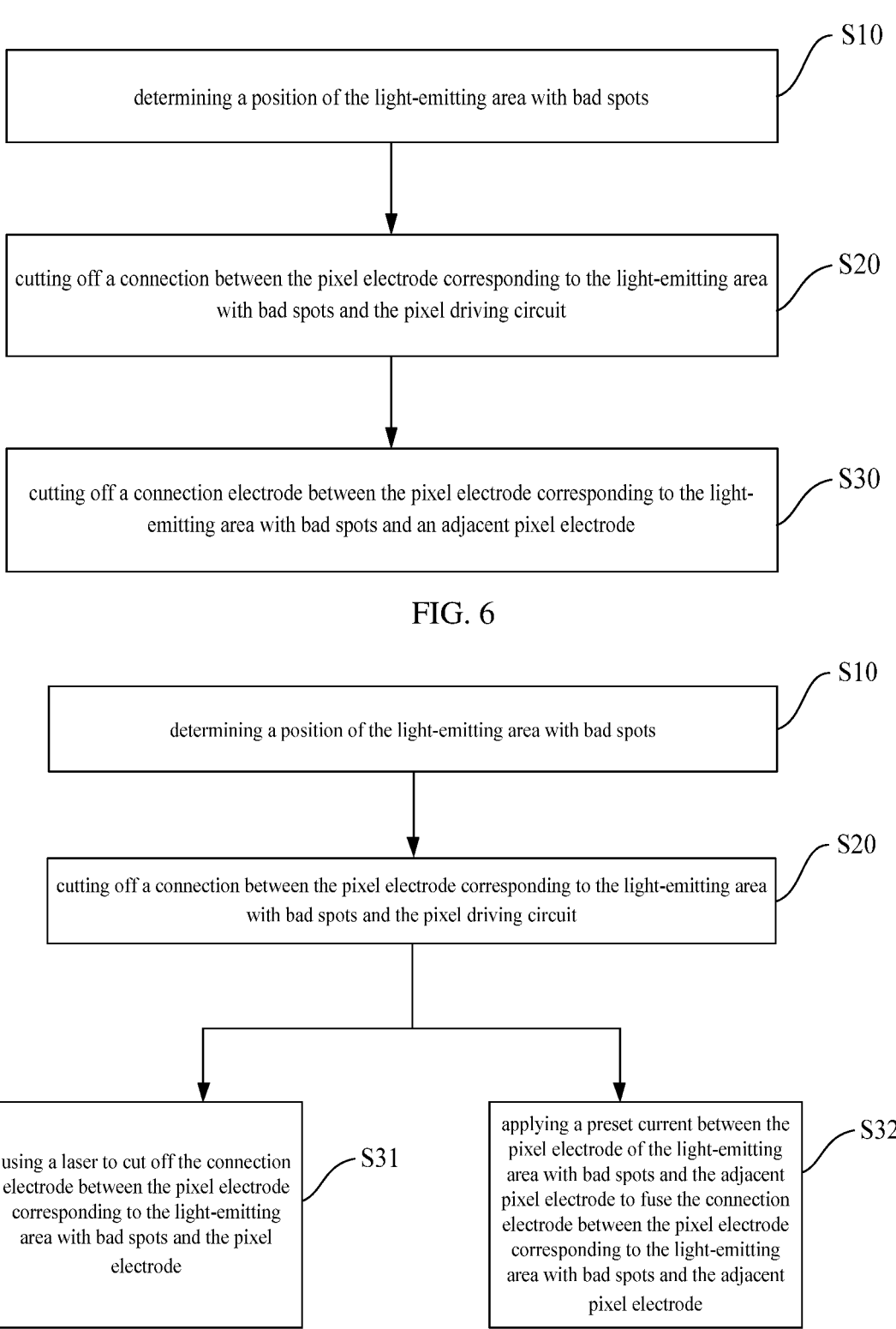

S10 determining a position of the light-emitting area with bad spots

S20 cutting off a connection between the pixel electrode corresponding to the light-emitting area with bad spots and the pixel driving circuit

S30 cutting off a connection electrode between the pixel electrode corresponding to the light-emitting area with bad spots and an adjacent pixel electrode

FIG. 6

S10 determining a position of the light-emitting area with bad spots

S20 cutting off a connection between the pixel electrode corresponding to the light-emitting area with bad spots and the pixel driving circuit

S31 using a laser to cut off the connection electrode between the pixel electrode corresponding to the light-emitting area with bad spots and the pixel electrode

S32 applying a preset current between the pixel electrode of the light-emitting area with bad spots and the adjacent pixel electrode to fuse the connection electrode between the pixel electrode corresponding to the light-emitting area with bad spots and the adjacent pixel electrode

FIG. 7

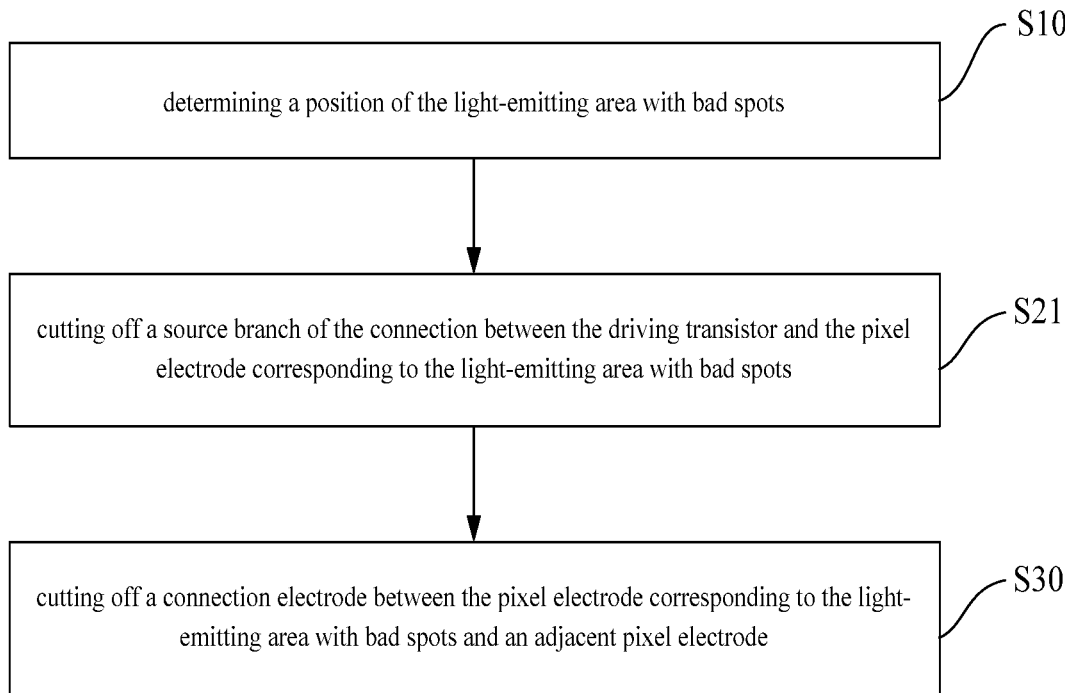

determining a position of the light-emitting area with bad spots — S10 cutting off a source branch of the connection between the driving transistor and the pixel electrode corresponding to the light-emitting area with bad spots — S21 cutting off a connection electrode between the pixel electrode corresponding to the light-emitting area with bad spots and an adjacent pixel electrode — S30

FIG. 8

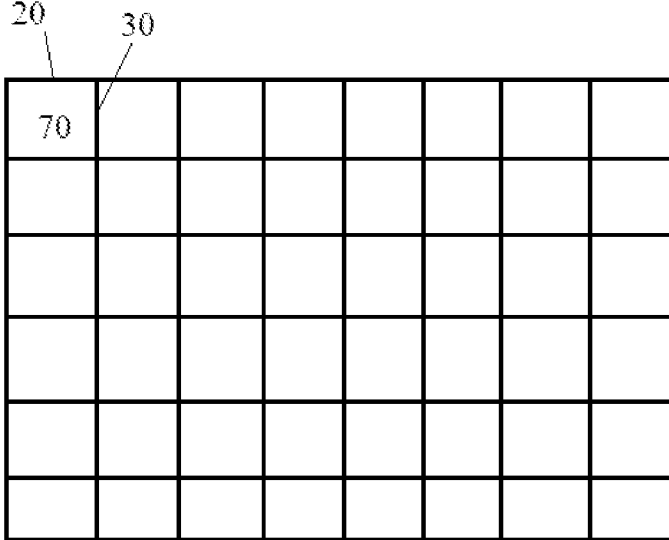

FIG. 9

ARRAY SUBSTRATE, DISPLAY PANEL AND METHOD FOR REPAIRING BAD SPOTS ON THE PANEL

CROSS-REFERENCE TO RELATED APPLICATIONS

The present application claims priority to Chinese Patent Application No. 202111155838.4, filed on Sep. 28, 2021, and titled "ARRAY SUBSTRATE, DISPLAY PANEL AND METHOD FOR REPAIRING BAD SPOTS ON THE PANEL", the entire contents of which are hereby incorporated by reference.

TECHNICAL FIELD

The present application relates to the field of display technology, and in particular to an array substrate, a display panel and a method for repairing bad spots on the panel.

BACKGROUND

Bad spots represent a poor display panel, when a sub-pixel in a display panel has bad spots, the entire sub-pixel area completely darkens and does not emit light or only emits light of one color, the sub-pixel area always display the same color, the display effect of the display panel is affected and the user experience is reduced. In the existing technology, when a sub-pixel has bad spots, if completely darkening, the sub-pixel with bad spots cannot be repaired. If only the light of one color can be emitted, the entire sub-pixel is darkened to turn the sub-pixel into dark spots, to weaken the effect of the sub-pixel with bad spots, but in fact, the dark spot also affects the display effect.

SUMMARY

The main purpose of the present application is to provide an array substrate, a display panel and a method for repairing bad spots on the panel, to solve the problem in the related art that an effect of repairing dark spots on the array substrate is poor.

In order to achieve the above purpose, the present application provides a method for repairing bad spots on the panel, including:

a substrate, a plurality of data lines and a plurality of scan lines provided on the substrate, wherein the plurality of data lines and the plurality of scan lines are insulated and intersected mutually to define a plurality of sub-pixel areas provided in an array, each sub-pixel area is provided with a sub-pixel, wherein the sub-pixel comprises:

a plurality of pixel electrodes being provided in a same layer and spaced to form a plurality of light-emitting areas, two adjacent pixel electrodes being electrically connected to each other via a connection electrode; and a pixel driving circuit being electrically connected to a corresponding data line, a corresponding scan line, and a corresponding pixel electrode.

In one embodiment, a thickness of the connection electrode is less than that of the pixel electrode.

In one embodiment, the array substrate further includes a flat layer provided between the pixel driving circuit and a layer provided with the plurality of pixel electrodes, the connection electrode and the plurality of pixel electrodes being provided on a side of the flat layer away from the pixel driving circuit, the flat layer being provided with a plurality of through holes, each pixel electrode passing through each through hole to contact with a corresponding pixel driving circuit.

In one embodiment, the connection electrode is a multi-bent structure on a surface of the flat layer.

In one embodiment, the array substrate further includes a pixel definition layer, a light-emitting layer, and a cathode laminated sequentially on the side of the flat layer away from the pixel driving circuit, the pixel definition layer being provided on the flat layer and covering the connection electrode and the plurality of pixel electrodes, the pixel definition layer being provided with a plurality of openings, each opening being provided towards each pixel electrode, the light-emitting layer being attached on surfaces of the plurality of openings and contacted with corresponding pixel electrodes, the cathode being attached on surfaces of the plurality of openings and contacted with the light-emitting layer to form the plurality of light-emitting areas; and the pixel driving circuit having an orthographic projection on the pixel definition layer and located outside the plurality of the light-emitting areas.

In one embodiment, the array substrate further includes: a power line provided on the substrate, the pixel driving circuit includes:

a driving transistor having a source connected to the plurality of pixel electrodes, and a drain connected to the power line;

a switching transistor having a drain connected to the plurality of data lines, and a gate connected to the plurality of scan lines; and a storage capacitor comprising a first electrode and a second electrode opposite to the first electrode, a gate of the driving transistor and a source of the switching transistor being connected to the first electrode, the second electrode and the drain of the driving transistor being connected to the power line.

In one embodiment, the array substrate includes an active layer, a gate insulating layer, a first metal layer, an interlayer dielectric layer, and a second metal layer laminated on the substrate from bottom to top;

the active layer is provided with an active layer pattern of the driving transistor and an active layer pattern of the switching transistor, the first metal layer is provided with the gate of the driving transistor, the gate of the switching transistor, and the first electrode;

the second metal layer is provided with the source and the drain of the driving transistor, the source and the drain of the switching transistor, the power line, and the second electrode; and the source and drain of the driving transistor pass through the interlayer dielectric layer to contact with the active layer pattern of the driving transistor, and the source and drain of the switching transistor pass through the interlayer dielectric layer to contact with the active layer pattern of the switching transistor.

The present application further provides a display panel, including an array substrate as mentioned above, wherein sub-pixels of the array substrate are red sub-pixels, green sub-pixels, blue sub-pixels or white sub-pixels.

The present application further provides a method for repairing bad spots on the panel, applied to an array substrate as mentioned above or a display panel as mentioned above, wherein the method for repairing bad spots on the panel includes:

determining a position of a light-emitting area with bad spots;

cutting off a connection between a pixel electrode corresponding to the light-emitting area with bad spots and a pixel driving circuit; and, cutting off a connection electrode between the pixel electrode corresponding to the light-emitting area with bad spots and an adjacent pixel electrode.

In one embodiment, the cutting off the connection electrode between the pixel electrode corresponding to the light-emitting area with bad spots and the adjacent pixel electrode includes:

using a laser to cut off the connection electrode between the pixel electrode corresponding to the light-emitting area with bad spots and the adjacent pixel electrode; or, applying a preset current between the pixel electrode corresponding to the light-emitting area with bad spots and the adjacent pixel electrode to fuse the connection electrode between the pixel electrode corresponding to the light-emitting area with bad spots and the adjacent pixel electrode.

In the array substrate proposed in the present application, each sub-pixel is divided into a plurality of light-emitting areas, and pixel electrodes corresponding to each light-emitting area are connected to a pixel driving circuit of the sub-pixel, and the adjacent pixel electrodes in the same sub-pixel are electrically connected to each other by connection electrodes. Under normal states, the pixel driving circuit receives control signals from the data lines and the scan lines, and inputs current to each pixel electrode to drive each light-emitting area to emit light. The connection electrode balances the current between each pixel electrode to balance the brightness of each light-emitting area. When there is a bad spot in a certain light-emitting area, only a connection between the pixel driving circuit and the light-emitting area is fused and the connection electrode between the pixel electrode corresponding to the light-emitting area and the adjacent pixel electrode is fused, to block the pixel driving circuit from continuously inputting current to the light-emitting area to darken the light-emitting area, and the other light-emitting areas in the same sub-pixel can still emit different light of colors under the control of the pixel driving circuit, to avoid that the sub-pixel area always displays the same color, to reduce an effect of the darkened light-emitting area on the display effect and repair the array substrate.

BRIEF DESCRIPTION OF THE DRAWINGS

In order to more clearly explain the embodiments of the present application or the technical solutions in the related art, the following will briefly introduce the drawings in the embodiments or the description of the related art. It is obvious that the drawings described below are only some embodiments of the present application. Other drawings can be obtained for those skilled in the art according to the structure shown in these drawings without paying creative labor.

FIG. 6 is a flowchart of a method for repairing bad spots on the panel according to an embodiment of the present application.

FIG. 7 is a flowchart of the method for repairing bad spots on the panel according to another embodiment of the present application.

FIG. 8 is a flowchart of the method for repairing bad spots on the panel according to another embodiment of the present application.

FIG. 9 is a structural view of a sub-pixel area according to another embodiment of the present application.

The realization of the purpose, functional features and advantages of the present application will be further described with reference to the drawings, in conjunction with the embodiments.

DETAILED DESCRIPTION OF THE EMBODIMENTS

The technical solutions in the embodiments of the present application will be clearly and completely described below in conjunction with the drawings in the embodiments of the present application, and it is obvious that the embodiments described are only a part of the embodiments of the present application, and not all of them.

Based on the embodiments of the present application, all other embodiments obtained by those skilled in the art without creative labor fall within the claimed scope of the present application. It should be noted that all directional indications in the embodiments of the present application (such as up, down, left, right, forward, backward, . . . ) are used only to explain the relative position relationship, movement, etc. among components in a particular posture (as shown in the attached figure), and if the particular posture is changed, the directional indications change accordingly.

In the present application, unless otherwise specified and limited, the terms "connected" and "fixed" are understood in a broad sense, for example, "fixed" can be a fixed connection, or a removable connection, or integrated, or a mechanical connection, or an electrical connection, or directly connected, or indirectly connected through an intermediate medium, or an internal connection of two components or an interaction relationship of two components, unless otherwise expressly limited. For those skilled in the art, the specific meaning of the above terms in the context of the present application can be understood as need.

In addition, the descriptions in the present application such as "first", "second", etc. are only used for descriptive purposes and are not to be understood as indicating or implying their relative importance or implicitly specifying the number of technical features indicated. Thus, the features defined with "first" and "second" may explicitly or implicitly include at least one such feature. In addition, the meaning of "and/or" appears throughout the text, including three parallel solutions. "A and/or B" is taken as an example, including A, or B, or A and B. In addition, the technical solutions between various embodiments can be combined with each other, but must be achieved by the those skilled in the art. When the combination of technical solutions appear contradictory or cannot be achieved, it should be considered that such a combination of technical solutions does not exist, and is not within the claimed scope of the present application.

Figure 1:
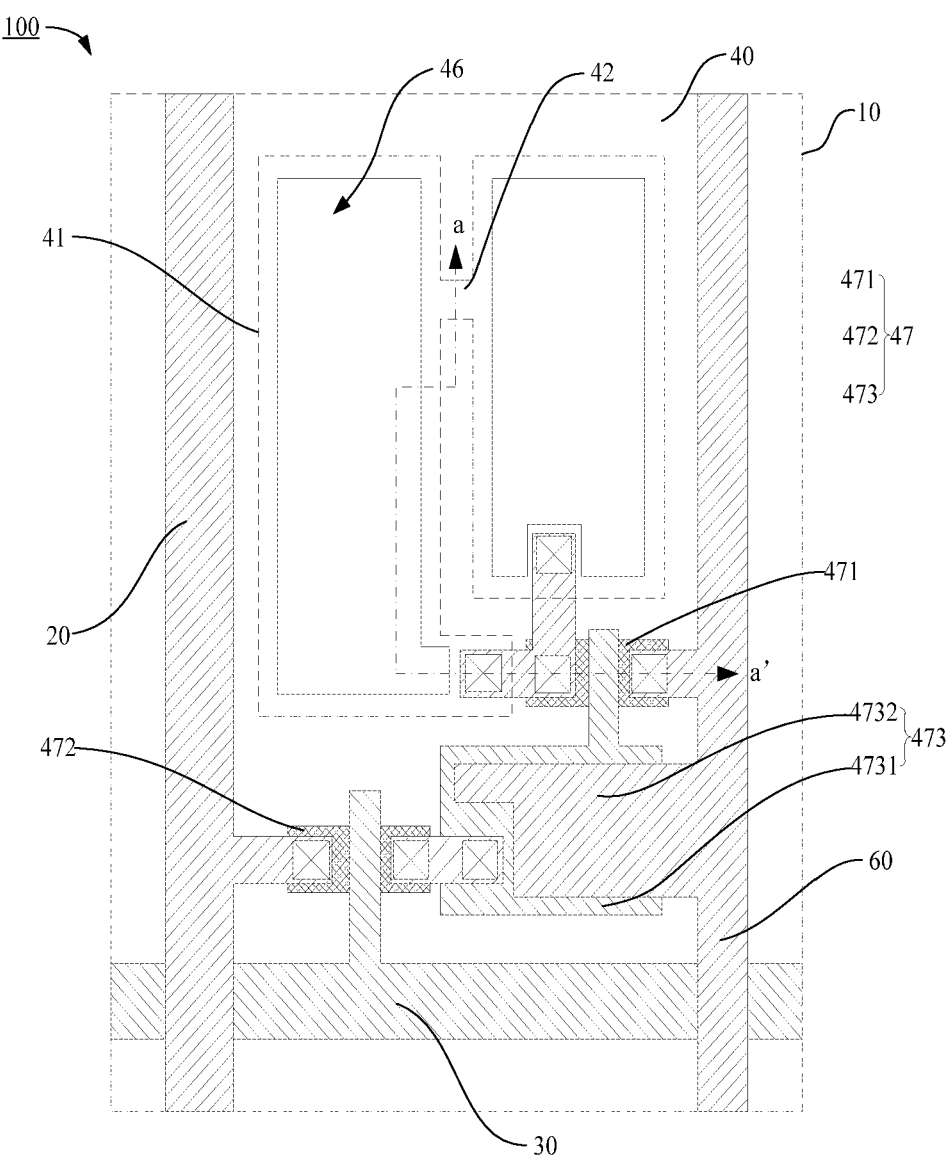
FIG. 1 is a structural view of the array substrate according to an embodiment of the present application.

The present application proposes an array substrate 100, referring to FIGS. 1 and 9, the array substrate 100 includes a substrate 10 and a plurality of data lines 20 and a plurality of scan lines 30 provided on the substrate 10. The plurality of data lines 20 and the plurality of scan lines 30 are insulated and intersected mutually to define a plurality of sub-pixel areas 70 provided in an array. Each sub-pixel area 70 has a sub-pixel 40. The sub-pixel 40 includes a plurality of pixel electrodes 41 and a pixel driving circuit 47. The plurality of the pixel electrodes 41 are provided in the same layer and spaced to form a plurality of light-emitting areas 46. Two adjacent pixel electrodes 41 are electrically connected to each other by a connection electrode 42. The pixel driving circuit 47 is electrically connected to a corresponding data line 20, a corresponding scan line 30 and a corresponding pixel electrode 41.

In an embodiment of the array substrate 100 of the present application, a thickness of the connection electrode 42 is less than that of the pixel electrode 41.

In the embodiment, the thickness of the connection electrode 42 is smaller than that of the pixel electrode 41. It should be understood that a resistance of the connection electrode 42 is inversely proportional to its cross-sectional area. The smaller the thickness of the connection electrode 42 is, the higher its resistance is. When power is applied to the sub-pixel 40, both the pixel electrode 41 and the connection electrode 42 generate certain heat. When the temperature of the connection electrode 42 reaches a preset temperature, the connection electrode 42 will be fused. The thickness of pixel electrode 41 is larger than that of connection electrode 42, and the resistance per unit area of pixel electrode 41 is smaller than the resistance of connection electrode 42, the heat generated by the connection electrode 42 is smaller than the heat generated by the pixel electrode 41. When a certain current is applied, only the connection electrode 42 is fused without damaging the pixel electrode 41.

Figure 2:
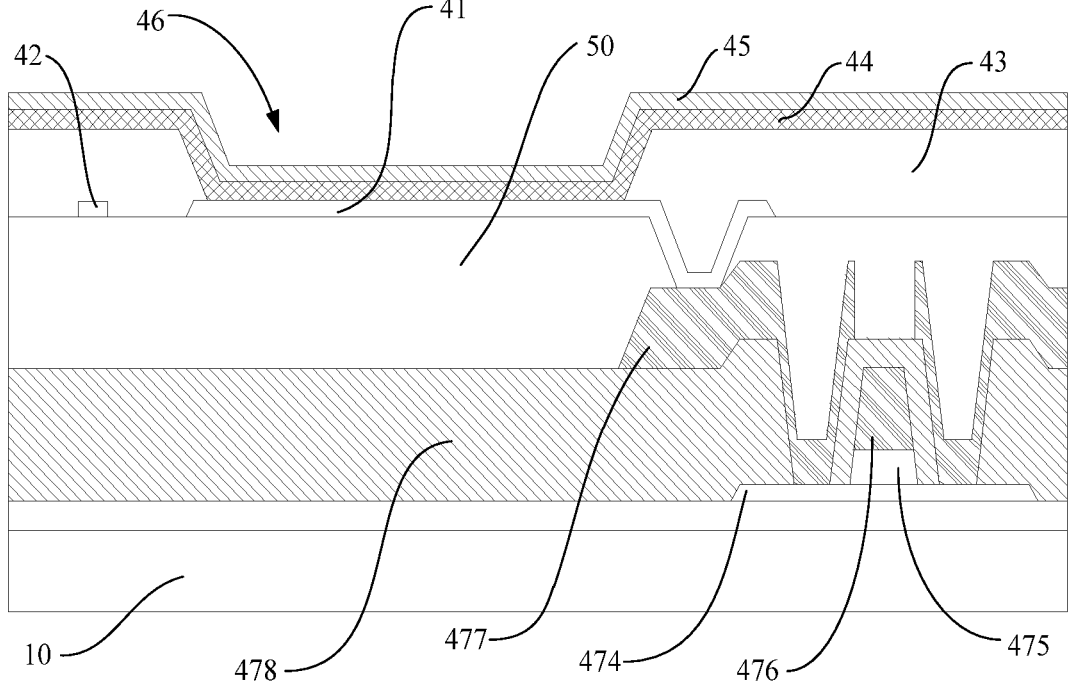
FIG. 2 is a cross-sectional view at a-a' line of FIG. 1.
Figure 10:
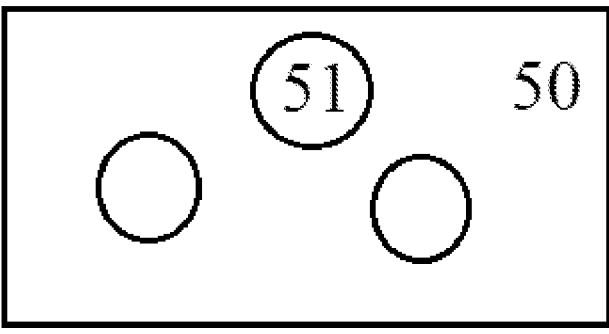
FIG. 10 is a structural view of a through hole according to another embodiment of the present application.

Referring to FIGS. 2 and 10, in an embodiment of the array substrate 100 of the present application, the array substrate 100 further includes a flat layer 50 provided between the pixel driving circuit 47 and the pixel electrode 41. The connection electrode 42 and the pixel electrodes 41 are provided on a side of the flat layer 50 away from the pixel driving circuit 47, the flat layer 50 is provided with a plurality of through holes 51. Each pixel electrode 41 passes through each through hole 51 and contacts with a corresponding pixel driving circuit 47.

In the embodiment, the array substrate 100 also includes a flat layer 50, the flat layer 50 is provided between the light-emitting device and the pixel driving circuit 47, the connection electrode 42 and a plurality of pixel electrodes 41 are on the side of the flat layer 50 away from the pixel driving circuit 47. As the flat layer 50 itself has high flatness, the plurality of pixel electrodes 41 of the sub-pixel 40 can be arranged flatly. The light-emitting device is flat, the flatness of the surface of the light-emitting device is optimized, and the laser focuses on the connection electrode 42 and fuses the connection electrode 42. The flat layer 50 is an insulating layer, and through holes 51 are opened on the flat layer 50. The pixel electrodes 41 corresponding to each light-emitting area 46 pass through the through hole 51 to connect to the pixel driving circuit 47, so that the pixel driving circuit 47 can input the current to the pixel electrodes 41 to drive the light-emitting device to emit light, and the pixel electrodes 41 corresponding to different light-emitting areas 46 are connected to the pixel driving circuit 47 via different through holes 51, and the adjacent pixel electrodes 41 are not in contact with each other, to avoid, when a pixel electrode 41 is cut off, mistakenly cutting off the adjacent pixel electrode 41.

Figure 3:
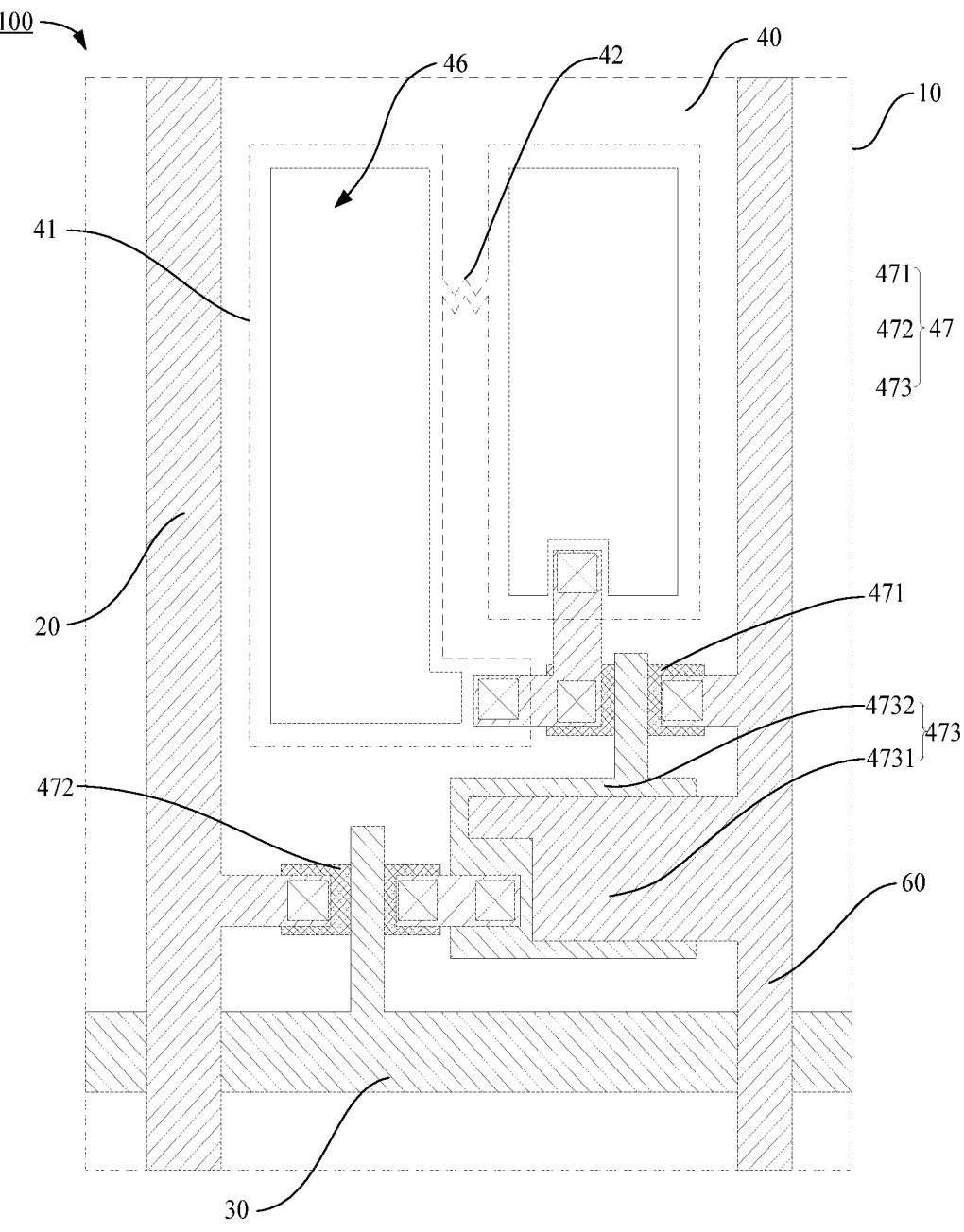
FIG. 3 is a structural view of the array substrate according to another embodiment of the present application.
Figure 4:
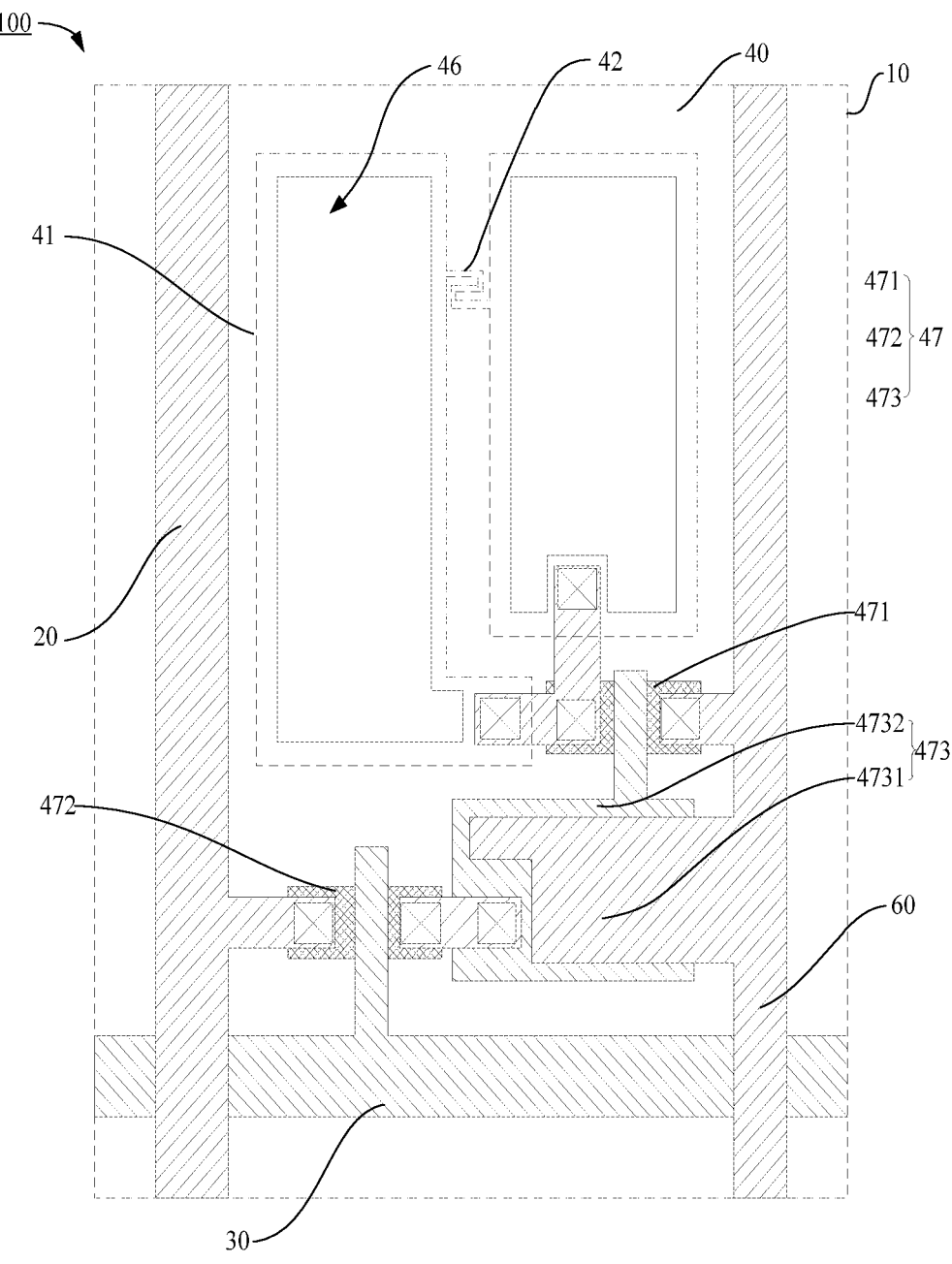
FIG. 4 is a structural view of the array substrate according to yet another embodiment of the present application.
Figure 5:
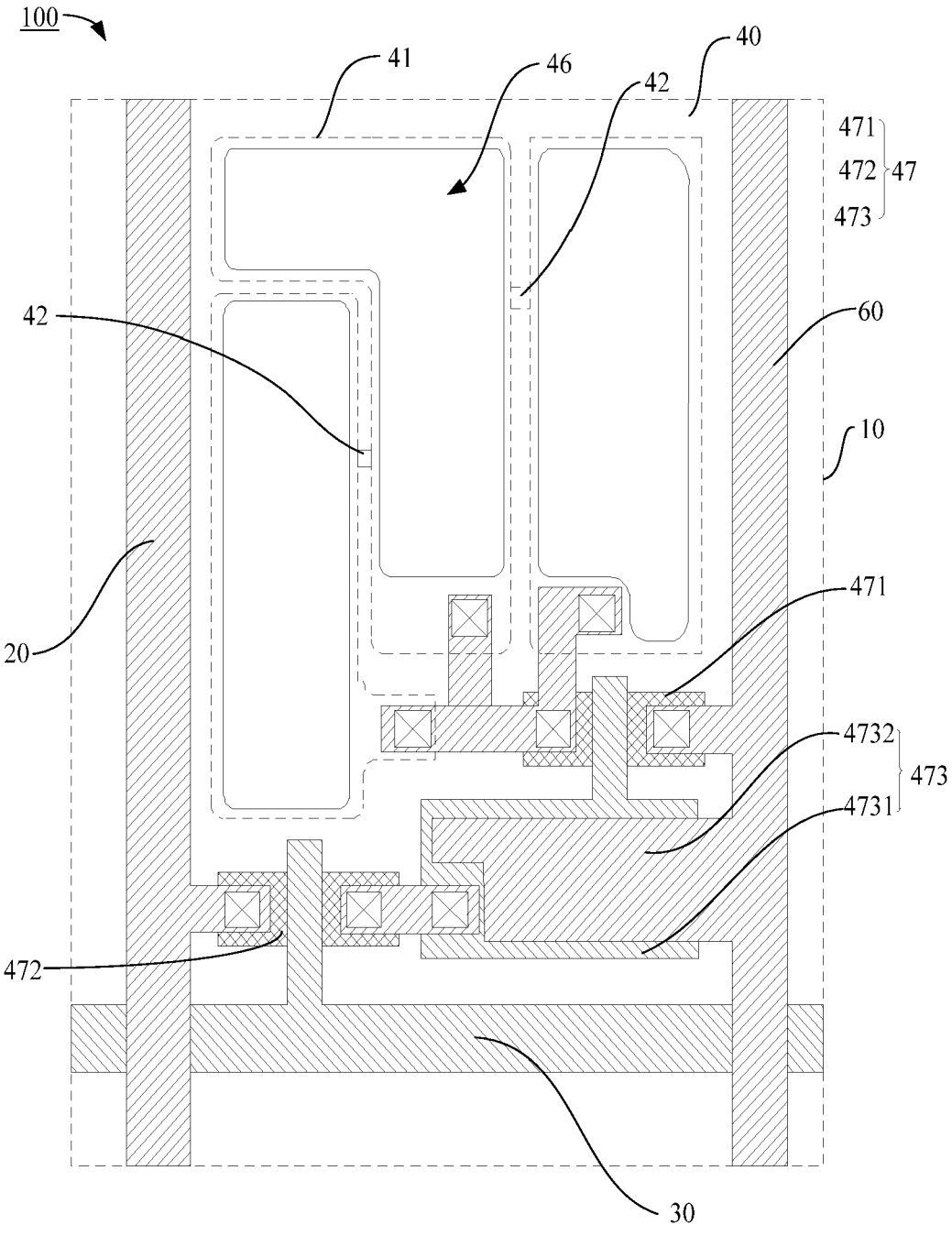
FIG. 5 is a structural view of the array substrate according to another embodiment of the present application.

Referring to FIGS. 3 and 4, in one embodiment of the array substrate 100 of the present application, the connection electrode 42 is multi-bent structure on a surface of the flat layer 50.

In the embodiment, the connection electrode 42 is multi-bent structure on the surface of the flat layer 50. It should be understood that a resistance of the connection electrode 42 is proportional to a length of the connection electrode 42, so that the length of the connection electrode 42 between two adjacent pixel electrodes 41 can be extended to increase the resistance of the connection electrode 42. When the connection electrode 42 is fused by using step S in the aforementioned method for repairing bad spots on the panel, the heat generated by the connection electrode 42 increases to quickly reach the melting point to fuse the connection electrode 42. It should be noted that in this embodiment, the connection electrode 42 is a multi-bent structure, which can be arc-shaped, rectangular or serrated, etc., and the length of the connection electrode 42 is increased and the area of the connection electrode 42 per unit area are increased, the specific shape of the connection electrode 42 is not limited here.

Figure 11:
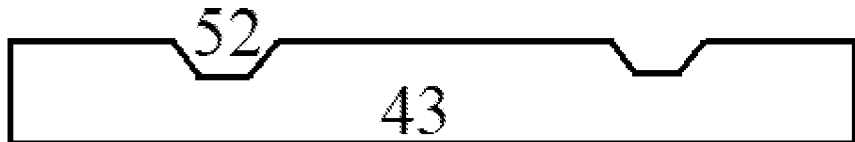
FIG. 11 is a structural view of an opening according to another embodiment of the present application.

Referring to FIGS. 2 and 11, in an embodiment of the array substrate 100 of the present application, the array substrate 100 further includes a pixel definition layer 43, a light-emitting layer 44, and a cathode 45 laminated sequentially on the side of the flat layer 50 away from the pixel driving circuit 47. The pixel definition layer 43 covers the connection electrode 42 and the pixel electrode 41. The pixel definition layer 43 is provided with a plurality of openings 52. Each opening 52 is provided towards each pixel electrode 41. The light-emitting layer 44 is attached on surfaces of the plurality of openings 52 to contact with the corresponding pixel electrode 41, the cathode 45 is attached on surfaces of the plurality of openings 52 to contact with the light-emitting layer 44 to form a plurality of the light-emitting areas 46.

The pixel driving circuit 47 has an orthographic projection on the pixel definition layer 43 and located outside the plurality of the light-emitting areas 46.

In the embodiment, the light-emitting device includes a pixel definition layer 43, a light-emitting layer 44 and a cathode 45 laminated sequentially on the side of the flat layer 50 away from the pixel driving circuit 47. It should be understood that both the connection electrode 42 and the pixel electrode 41 are provided on the surface of the side of the flat layer 50 away from the pixel driving circuit 47. When the pixel definition layer 43 covers the connection electrode 42 and the pixel electrode 41. The pixel definition layer 43 is provided with a plurality of openings 52. Each opening 52 is provided towards each pixel electrode 41. The light-emitting layer 44 and the cathode 45 are both partially recessed and provided in the openings 52. The light-emitting layer 44 in the openings 52 is sandwiched between the pixel electrode 41 and the cathode 45. The light-emitting area 46 of the sub-pixel 40 is formed at the opening 52. When the pixel driving circuit 47 supplies power to the pixel electrode 41 until the voltage between the pixel electrode 41 and the cathode 45 reaches a specific voltage, electron holes of the pixel electrode 41 and the electrons of the cathode 45 move to the light-emitting layer 44, and the electron holes and electrons compound in the light-emitting layer 44 to make the light-emitting layer 44 to light.

The array substrate 100 of the present application is a bottom-emitting array substrate 100, and the pixel driving circuit 47 has an orthographic projection on the pixel definition layer 43 and located outside the opening 52. It should be understood that in the array substrate 100, the light is transmitted from sides of the pixel definition layer 43 and the pixel driving circuit 47, and the emitting-light area 46 is formed on the opening 52 of the pixel definition layer 43. In the embodiment, the pixel driving circuit 47 has an ortho- graphic projection on the the pixel definition layer 43 and located outside the openings 52, to prevent the pixel driving circuit 47 from blocking the light-emitting area 46 and increase the opening rate of the sub-pixel 40. The risk of damaging other adjacent structures is reduced when a con- nection position between the corresponding pixel electrode 41 and the pixel driving circuit 47 is cut off.

In an embodiment of the array substrate 100 of the present application, the pixel electrode 41 is a transparent electrode and the cathode 45 is a reflective electrode.

In this embodiment, the array substrate 100 is bottom- emitting array substrate 100, the substrate 10 is made of light-transmitting material, which can be a transparent glass substrate or a transparent plastic substrate, so that the light emitted from the sub-pixel 40 can be transmitted from a side of the substrate 10, and the pixel electrode 41 is made of transparent conductive material to avoid blocking the light emitted from the light-emitting layer 44 and to improve the opening rate of the array substrate 100. The pixel electrode 41 is provided with a transparent conductive film. The transparent conductive film can be but not limited to tin doped indium trioxide (ITO), aluminum doped zinc oxide (AZO) or indium zinc oxide (IZO) and other materials.

Referring to FIG. 1, FIG. 3, FIG. 4 or FIG. 5, in an embodiment of the array substrate 100 of the present appli- cation, the array substrate 100 further includes a power line 60 provided on the substrate 10, the pixel driving circuit 47 includes:

a driving transistor 471 having a source connected to a plurality of the pixel electrodes 41 and a drain con- nected to the power line 60;
    a switching transistor 472 having a drain connected to the data line 20 and a gate connected to the scan line 30; and
    a storage capacitor 473 including a first electrode 4731 and a second electrode 4732 opposite to the first electrode 4731, a gate of the driving transistor 471 and a source of the switching transistor 472 being con- nected to the first electrode 4731, and the second electrode 4732 and the drain of the driving transistor 471 both being connected to the power line 60.

In the embodiment, the array substrate 100 also includes a power line 60, a data line 20, and a scan line 30, and the pixel driving circuit 47 includes a driving transistor 471, a switching transistor 472, and a storage capacitor 473. The switching transistor 472 conducts according to a scan signal from the scan line 30, and thus receives the data signal from the data line 20, and stores the data signals in the storage capacitor 473, and the driving transistor 471 allows the driving current corresponding to the data signal stored in the storage capacitor 473 to flow into the pixel electrode 41 to control the light-emitting state of the light-emitting device. In the actual application, the transient voltage varies within the driving transistor 471 when the power is turned on, the storage capacitor 473 is set to enable voltage compensation of the driving transistor 471 when the voltage in the control circuit is unstable, the effect of the current flowing through the driving transistor 471 is reduced and the display quality of the display panel is ensured.

Referring to FIG. 2, in an embodiment of array substrate 100 of the present application, the array substrate 100 includes an active layer 474, a gate insulating layer 475, a first metal layer 476, an interlayer dielectric layer 478, and a second metal layer 477 laminated on the substrate 10 sequentially from bottom to top.

The active layer 474 is provided with an active layer pattern of the driving transistor 471 and an active layer pattern of the switching transistor 472, the first metal layer 476 is provided with the gate of the driving transistor 471, the gate of the switching transistor 472, and the first elec- trode 4731. The second metal layer 477 is provided with the source and the drain of the driving transistor 471, the source and drain of the switching transistor 472, the power line 60, and the second electrode 4732. The source and drain of the driving transistor 471 pass through the interlayer dielectric layer 478 respectively to contact with the active layer pattern of the driving transistor 471. The source and drain of the switching transistor 472 pass through the interlayer dielec- tric layer 478 respectively to contact with the active layer pattern of the switching transistor 472.

In the embodiment, the array substrate 100 includes an active layer 474, a gate insulating layer 475, a first metal layer 476, an interlayer dielectric layer 478, and a second metal layer 477 laminated sequentially from bottom to top. i.e., when the array substrate 100 of the present application is manufactured, the active layer 474 is laid on the substrate 10. The active layer pattern of the driving transistor 471 and the active layer pattern of the switching transistor 472 are etched on the active layer 474. The active layer pattern of the driving transistor 471 and the active layer pattern of the switching transistor 472 are covered with the gate insulating layer 475, and then the first metal layer 476 is laid on the gate insulating layer 475. The gate of the driving transistor 471, the gate of the switching transistor 472, the scan line 30, and the first electrode 4731 are etched on the first metal layer 47. The first electrode 4731 and and the gate of the driving transistor 471 are integrally provided, and then the interlayer dielectric layer 478 is laminated on the first metal layer 476 and through holes 51 are etched on the interlayer dielectric layer 478 for communicating the active layer pattern of the driving transistor 471 with the active layer pattern of the switching transistor 472, and then the second metal layer 477 is laid on the interlayer dielectric layer 478. A part of the second metal layer 477 is provided in the through holes 51 to contact with the active layer pattern of the driving transistor 471 and the active layer pattern of the switching transistor 472. The source and drain of the driving transistor 471, the source and drain of the switching transistor 472, the power line 60, and the second electrode 4732 are etched on the second metal layer 477. The second electrode 4732 is integrated with the power line 60 and is laminated with the first electrode 4731 located on the first metal layer 476, to set the pixel driving circuit 47 completely. The flat layer 50 is laid on the pixel driving circuit 47, and the pixel electrode 41, the connection electrode 42, the pixel definition layer 43, the light-emitting layer 44, and the cathode 45 are built on the basis of the flat layer 50 to manufacture completely the array substrate 100.

In the embodiment, the switching transistor 472, the driving transistor 471, and the storage capacitor 473 are all located in the same layer to make the array substrate 100 lighter and thinner.

Referring to FIG. 6, based on the above hardware archi- tecture, the present application also proposes a method for repairing bad spots on the panel, which includes the follow- ing steps:

step S10, determining a position of the light-emitting area with bad spots.

step S20, cutting off a connection between the pixel electrode 41 corresponding to the light-emitting area with bad spots and the pixel driving circuit 47.

step S30, cutting off a connection electrode 42 between the pixel electrode 41 corresponding to the light-emitting area with bad spots and an adjacent pixel electrode 41.

In the embodiment, the array substrate 100 includes a plurality of data lines 20 and a plurality of scan lines 30, and the data lines 20 and the scan lines 30 are all conductive lines provided on the substrate. The scan lines 30 are arranged along a first direction of the substrate 10 and the data lines 20 are arranged along a second direction of the substrate 10. A plurality of data lines 20 and a plurality of scan lines 30 overlap each other to divide the surface of the substrate into a plurality of sub-pixel areas, i.e., any two adjacent data lines 20 and any two adjacent scan lines 30 are intersected mutually to enclose a pixel area on the surface of the substrate. The array substrate 100 further includes a plurality of sub-pixels 40 arranged on the substrate 10 in an array. Each sub-pixel 40 is provided in the sub-pixel area 70, each sub-pixel 40 includes a pixel driving circuit 47 and a plurality of pixel electrodes 41, and each pixel electrode 41 is connected to a source of a driving transistor 471 in the pixel driving circuit 47. As in the illustrated embodiment, the source of the driving transistor 471 is provided with a plurality of branches to connect to different pixel electrodes, to form a plurality of light-emitting areas 46 in the sub-pixel area 70 correspondingly. In the embodiment, each sub-pixel 40 includes a plurality of light-emitting areas 46, and each sub-pixel 40 includes two or more light-emitting areas 46, and two adjacent pixel electrodes 41 are electrically connected to each other by connection electrodes 42. Under normal states, the pixel driving circuit 47 receives control signals from the data line 20 and scan line 30 to input the current to each pixel electrode 41 to make a plurality of light-emitting areas 46 to emit light, and the connection electrode 42 is set to balance the current between each pixel electrode 41, so that the light-emitting brightness of each light-emitting area 46 is the same.

When there is a bad spot in one of the light-emitting areas 46 of the sub-pixel 40, according to the above-mentioned method for repairing bad spots on the panel, the connection between the pixel driving circuit 47 and the light-emitting area with bad spots is fused, and the connection electrode 42 between the pixel electrode 41 corresponding to the light-emitting area with bad spots and the adjacent pixel electrode 41 is fused, so that the current input to the pixel electrode 41 corresponding to the light-emitting area 46 is blocked and the light-emitting area 46 darkens. Other light-emitting areas 46 in the same sub-pixel 40 can still emit different light of colors under the control of the pixel driving circuit 47, to avoid that the sub-pixel 40 always displays the same color to affect the entire display effect, to reduce an effect of the dark spots on the display effect and repair the array substrate.

Therefore, it is understood that in the array substrate 100 proposed in the present application, each sub-pixel 40 is divided into a plurality of light-emitting areas 46, and the pixel electrodes 41 corresponding to each light-emitting area 46 are connected to the pixel driving circuit 47 of the sub-pixel 40, and the adjacent pixel electrodes 41 in the same sub-pixel 40 are electrically connected to each other by connection electrodes 42. Under normal states, the pixel driving circuit 47 receives control signals from the data line 20 and the scan line 30 to input the current to each pixel electrode 41 to drive each light-emitting area 46 to emit light, and the connection electrode 42 can balance the current between each pixel electrode 41 to balance the brightness of each light-emitting area 46. When there is a bad spot in a certain light-emitting area 46, only the connection between the pixel driving circuit 47 and the light-emitting area 46 is fused, and the connection electrode 42 between the corresponding pixel electrode 41 and the adjacent pixel electrode 41 is fused, so that the current continuously input to the light-emitting area 46 from the pixel driving circuit 47 is blocked, and the light-emitting area 46 darkens, and the other light-emitting areas 46 in the same sub-pixel 40 can still emit different light of colors under the control of the pixel driving circuit 47, to avoid that the sub-pixel 40 always displays the same color, to reduce an effect of the darkened emitting-light on the display effect and repair the array substrate 100.

It should be noted that in the method for repairing bad spots on the panel proposed in the present application, step S20, step S30 does not constitute a substantial limitation on the order, those skilled in the art, when in the specific implementation, maybe execute first S30 and then S20, etc., only there exists a light-emitting area with bad spots, the pathway to the pixel electrode 41 corresponding to the light-emitting area 46 to supply energy can be cut off, whether step S20 or step S30 is executed first, it should be within the claimed scope of the present application.

Referring to FIG. 7, in some embodiments, in the method for repairing bad spots on the panel proposed by the present application, the step of cutting off the connection electrode 42 between the pixel electrode 41 corresponding to the light-emitting area with bad spots and the adjacent pixel electrode 41 includes:

step S31, using a laser to cut off the connection electrode 42 between the pixel electrode 41 corresponding to the light-emitting area with bad spots and the pixel electrode 41.

It should be understood that when one of the light-emitting areas 46 of the sub-pixel 40 has a dark spot that is always bright, according to the above method for repairing bad spots on the panel, the laser is used to fuse the connection between the pixel electrode 41 corresponding to the light-emitting area with bad spots and the pixel driving circuit 47 and fuse the connection electrode 42 between the pixel electrode 41 corresponding to the light-emitting area with bad spots and the adjacent pixel electrode 41, and only a focus position of the laser needs to be set and accurately aligned with the fusion point. The operation is more convenient.

Referring to FIG. 7, based on the above hardware architecture, in the method for repairing bad spots on the panel proposed by the present application, the step of fusing the connection electrode 42 between the pixel electrode 41 corresponding to the light-emitting area with bad spots and the adjacent pixel electrode 41 includes:

step S32, applying a preset current between the pixel electrode 41 of the light-emitting area with bad spots and the adjacent pixel electrode 41 to fuse the connection electrode 42 between the pixel electrode 41 corresponding to the light-emitting area with bad spots and the adjacent pixel electrode 41.

When one of the light-emitting areas 46 of the sub-pixel 40 has a dark spot that is always bright, according to the above method for repairing bad spots on the panel, the connection between the pixel driving circuit 47 and the light-emitting area with bad spots is fused, and a preset current is applied between the pixel electrode 41 of the light-emitting area with bad spots and the adjacent pixel electrode 41 to fuse the connection electrode 42 between the pixel electrode 41 corresponding to the light-emitting area with bad spots and the adjacent pixel electrode 41, so that the current input to the pixel electrode 41 corresponding to the light-emitting area 46 from the array substrate 100 is blocked, and the light-emitting area 46 darkens, to avoid that the light-emitting area 46 only emits a color of light and affects the overall display effect. This embodiment uses an additional preset current to fuse the connection electrode 42 between the pixel electrode 41 of the light-emitting area with bad spots and the adjacent pixel electrode 41, to reduce the risk of damaging the adjacent pixel electrode 41 or other layers in the array substrate 100.

Referring to FIG. 8, in the method for repairing bad spots on the panel proposed in the present application, the step of cutting off a connection between the pixel electrode 41 corresponding to the light-emitting area with bad spots and the pixel driving circuit 47 includes:

step S21, cutting off a source branch of the connection between the driving transistor 471 and the pixel electrode 41 corresponding to the light-emitting area with bad spots.

In this embodiment, when there is a bad spot in the light-emitting area 46, the source branch of the driving transistor 471 connected to the pixel electrode 41 corresponding to the light-emitting area 46 is cut off to block the pixel driving circuit 47 from inputting the current to the pixel electrode 41 corresponding to the light-emitting area 46, and then the connection electrode 42 between the pixel electrode 41 corresponding to the light-emitting area 46 and the adjacent pixel electrode 41 is cut off to completely block the current input to the pixel electrode 41, to make the light-emitting area 46 darken. It should be understood that the pixel electrodes 41 passes through the flat layer 50 to connect to the source of the driving transistor 471, and cutting off the source branches on the same layer is simpler than cutting off the pixel electrodes 41 that are set across the layer.

The present application also proposes a display panel including an array substrate 100 as previously described, and the specific structure of the array substrate 100 is detailed in the previous embodiment. Specifically, the display panel includes the substrate and the array substrate 100 as described in the previous embodiments. Since the display panel proposed in the present application adopts all the technical solutions of all the previous embodiments of the array substrate 100, it has at least all the beneficial effects of all the technical solutions of all the previous embodiments, which will not be repeated here.

It should be noted that in the embodiment of the present application embodiment, the display panel can be applied to any product with display function such as a monitor, a television, a digital photo frame, a cell phone or a tablet PC.

When there is a bad spot on the display panel, the display panel can be repaired by applying the aforementioned method for repairing bad spots on the panel of array substrate 100, the connection between the pixel driving circuit 47 and the light-emitting area with bad spots is fused, and the connection electrode 42 between the pixel electrode 41 of the light-emitting area with bad spots and the adjacent pixel electrode 41 is also fused. The connection electrode 42 between the pixel electrode 41 and the adjacent pixel electrode 41 in the light-emitting area with bad spots can be directly fused by the laser or applying a preset current between the pixel electrode 41 and the adjacent pixel electrode 41, so that the current input by the the array substrate 100 to the pixel electrode 41 corresponding to the light-emitting area 46 can be blocked, to make the light-emitting area 46 darken, to avoid that the light-emitting area 46 emits only one color of light to affect the overall display effect.

In an embodiment of the display panel of the present application, the sub-pixel 40 is a red sub-pixel 40, a green sub-pixel 40, a blue sub-pixel 40 or a white sub-pixel 40.

Specifically, the display panel of the present application includes a plurality of sub-pixels 40 arranged in an array, each sub-pixel 40 includes the array substrate 100 in the previous embodiment. In some embodiments, three adjacent sub-pixels 40 are defined as a pixel unit, and each sub-pixel 40 in each pixel unit handles a color channel corresponding to the red, green, and blue primary colors to form red sub-pixels 40, green sub-pixels 40, and blue sub-pixels 40. In specific applications, each color sub-pixel 40 has different brightness according to the control voltage in each sub-pixel 40, and the combination of different brightness of the three colors can improve the resolution of the display panel. Further, in some embodiments, the display panel defines four adjacent sub-pixels 40 as a pixel unit, and each sub-pixel 40 in each pixel unit handles one color channel corresponding to red, green, blue, and white colors to form red sub-pixels 40, green sub-pixels 40, blue sub-pixels 40, and white sub-pixels 40. The brightness of the display panel is increased while the resolution of the display panel is increased.

The above mentioned is only a preferred embodiment of the present application, but not to limit the claimed scope of the present application. Any equivalent structural transformation made under the inventive concept of the present application by using the content of the specification of the present application and the drawings, or direct/indirect application in other related technical fields are included in the claimed scope of the present application.

The invention claimed is:

1. An array substrate of a display panel, comprising a substrate, a plurality of data lines and a plurality of scan lines provided on the substrate, wherein the plurality of data lines and the plurality of scan lines are insulated and intersected mutually to define a plurality of sub-pixel areas provided in an array, each sub-pixel area is provided with a sub-pixel, wherein the sub-pixel comprises:

a plurality of pixel electrodes provided in a same layer and spaced to form a plurality of light-emitting areas, two adjacent pixel electrodes being electrically connected to each other via a connection electrode; and a pixel driving circuit electrically connected to a corresponding data line, a corresponding scan line, and a corresponding pixel electrode;

wherein the array substrate further comprises a flat layer provided between the pixel driving circuit and a layer provided with the plurality of pixel electrodes, the connection electrode and the plurality of pixel electrodes being provided on a side of the flat layer away from the pixel driving circuit, the flat layer being provided with a plurality of through holes, each pixel electrode passing through each through hole to contact with a corresponding pixel driving circuit;

wherein the array substrate further comprises a power line provided on the substrate, wherein the pixel driving circuit comprises:

a driving transistor having a source connected to the plurality of pixel electrodes, and a drain connected to the power line;

a switching transistor having a drain connected to the plurality of data lines, and a gate connected to the plurality of scan lines; and a storage capacitor comprising a first electrode and a second electrode opposite to the first electrode, a gate of the driving transistor and a source of the switching transistor being connected to the first electrode, the second electrode and the drain of the driving transistor being connected to the power line;

wherein repairing bad spots on the array substrate of the display panel comprises:

determining a position of a light-emitting area of the plurality of light-emitting areas with bad spots;

cutting off the connection between a pixel electrode of the plurality of pixel electrodes corresponding to the light-emitting area with bad spots and the pixel driving circuit; and cutting off the connection electrode between the pixel electrode corresponding to the light-emitting area with bad spots and an adjacent pixel electrode of the two adjacent pixel electrodes.

2. The array substrate of the display panel according to claim 1, wherein a thickness of the connection electrode is less than that of the pixel electrode.

3. The array substrate of the display panel according to claim 1, wherein the connection electrode is a multi-bent structure on a surface of the flat layer.

4. The array substrate of the display panel according to claim 1, further comprising a pixel definition layer, a light-emitting layer, and a cathode laminated sequentially on the side of the flat layer away from the pixel driving circuit, the pixel definition layer being provided on the flat layer and covering the connection electrode and the plurality of pixel electrodes, the pixel definition layer being provided with a plurality of openings, each opening being provided towards each pixel electrode, the light-emitting layer being attached on surfaces of the plurality of openings and contacted with corresponding pixel electrodes, the cathode being attached on surfaces of the plurality of openings and contacted with the light-emitting layer to form the plurality of light-emitting areas; and the pixel driving circuit having an orthographic projection on the pixel definition layer and located outside the plurality of the light-emitting areas.

5. The array substrate of the display panel according to claim 1, wherein the array substrate comprises an active layer, a gate insulating layer, a first metal layer, an interlayer dielectric layer, and a second metal layer laminated on the substrate from bottom to top;

wherein the active layer is provided with an active layer pattern of the driving transistor and an active layer pattern of the switching transistor, the first metal layer is provided with the gate of the driving transistor, the gate of the switching transistor, and the first electrode;

the second metal layer is provided with the source and the drain of the driving transistor, the source and the drain of the switching transistor, the power line, and the second electrode; and the source and drain of the driving transistor pass through the interlayer dielectric layer to contact with the active layer pattern of the driving transistor, and the source and drain of the switching transistor pass through the interlayer dielectric layer to contact with the active layer pattern of the switching transistor.

6. A display panel, comprising an array substrate, wherein the array substrate comprises:

a substrate, a plurality of data lines and a plurality of scan lines provided on the substrate, wherein the plurality of data lines and the plurality of scan lines are insulated and intersected mutually to define a plurality of sub-pixel areas provided in an array, each sub-pixel area is provided with a sub-pixel, wherein sub-pixels of the array substrate are red sub-pixels, green sub-pixels, blue sub-pixels or white sub-pixels, wherein the sub-pixel comprises:

a plurality of pixel electrodes provided in a same layer and spaced to form a plurality of light-emitting areas, two adjacent pixel electrodes being electrically connected to each other via a connection electrode; and a pixel driving circuit electrically connected to a corresponding data line, a corresponding scan line, and a corresponding pixel electrode;

wherein the array substrate further comprises a flat layer provided between the pixel driving circuit and a layer provided with the plurality of pixel electrodes, the connection electrode and the plurality of pixel electrodes being provided on a side of the flat layer away from the pixel driving circuit, the flat layer being provided with a plurality of through holes, each pixel electrode passing through each through hole to contact with a corresponding pixel driving circuit;

wherein the display panel further comprises a power line provided on the substrate, and the pixel driving circuit comprises:

a driving transistor having a source connected to the plurality of pixel electrodes, and a drain connected to the power line;

a switching transistor having a drain connected to the plurality of data lines, and a gate connected to the plurality of scan lines; and a storage capacitor comprising a first electrode and a second electrode opposite to the first electrode, a gate of the driving transistor and a source of the switching transistor being connected to the first electrode, the second electrode and the drain of the driving transistor being connected to the power line;

wherein repairing bad spots on the display panel comprises:

determining a position of a light-emitting area of the plurality of light-emitting areas with bad spots;

cutting off the connection between a pixel electrode of the plurality of pixel electrodes corresponding to the light-emitting area with bad spots and the pixel driving circuit; and cutting off the connection electrode between the pixel electrode corresponding to the light-emitting area with bad spots and an adjacent pixel electrode of the two adjacent pixel electrodes.

7. The display panel according to claim 6, wherein a thickness of the connection electrode is less than that of the pixel electrode.

8. The display panel according to claim 6, wherein the connection electrode is a multi-bent structure on a surface of the flat layer.

9. The display panel according to claim 6, further comprising a pixel definition layer, a light-emitting layer, and a cathode laminated sequentially on the side of the flat layer away from the pixel driving circuit, the pixel definition layer being provided on the flat layer and covering the connection electrode and the plurality of pixel electrodes, the pixel definition layer being provided with a plurality of openings, each opening being provided towards each pixel electrode, the light-emitting layer being attached on surfaces of the plurality of openings and contacted with corresponding pixel electrodes, the cathode being attached on surfaces of the plurality of openings and contacted with the light-emitting layer to form the plurality of light-emitting areas; and the pixel driving circuit having an orthographic projection on the pixel definition layer and located outside the plurality of light-emitting areas.

10. The array substrate of a display panel according to claim 1, wherein the cutting off the connection electrode between the pixel electrode corresponding to the light-emitting area with bad spots and the adjacent pixel electrode comprises:

using a laser to cut off the connection electrode between the pixel electrode corresponding to the light-emitting area with bad spots and the adjacent pixel electrode; or applying a preset current between the pixel electrode corresponding to the light-emitting area with bad spots and the adjacent pixel electrode to fuse the connection electrode between the pixel electrode corresponding to the light-emitting area with bad spots and the adjacent pixel electrode.

\* \* \* \* \*